(12) United States Patent
Furuhata

(10) Patent No.: US 6,337,250 B2
(45) Date of Patent: *Jan. 8, 2002

(54) SEMICONDUCTOR DEVICE CONTAINING MOS ELEMENTS AND METHOD OF FABRICATING THE SAME

(75) Inventor: Tomoyuki Furuhata, Sakata (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/155,357

(22) PCT Filed: Jan. 28, 1998

(86) PCT No.: PCT/JP98/00337

§ 371 Date: Mar. 8, 1999

§ 102(e) Date: Mar. 8, 1999

(87) PCT Pub. No.: WO98/34275

PCT Pub. Date: Aug. 6, 1998

(30) Foreign Application Priority Data

Jan. 31, 1997 (JP) .............................................. 9-019103
May 29, 1997 (JP) .............................................. 9-140657

(51) Int. Cl.⁷ ............................................. H01L 21/336
(52) U.S. Cl. ........................ 438/301; 438/257; 438/286
(58) Field of Search ................................. 438/301, 257, 438/258, 262, 263, 264, 266, 587, 286, 275; 257/315

(56) References Cited

U.S. PATENT DOCUMENTS

| | | | | |
|---|---|---|---|---|
| 4,795,719 A | * | 1/1989 | Eitan ............................ | 438/257 |
| 5,372,963 A | * | 12/1994 | Mori ............................ | 438/257 |
| 5,432,109 A | * | 7/1995 | Yamada ........................ | 437/43 |
| 5,491,101 A | | 2/1996 | Miyamoto et al. ........... | 438/257 |
| 5,510,280 A | | 4/1996 | Noda ........................... | 438/179 |
| 5,523,250 A | | 6/1996 | Jeong et al. .................. | 438/297 |
| 5,580,807 A | | 12/1996 | Sery et al. .................... | 438/598 |
| 5,708,285 A | * | 1/1998 | Otani et al. .................. | 257/315 |
| 5,914,514 A | | 6/1999 | Dejenfelt et al. ............. | 257/316 |

FOREIGN PATENT DOCUMENTS

| | | |
|---|---|---|
| EP | 0 313 427 A1 | 4/1989 |
| GB | 2 301 709 A | 12/1996 |
| JP | A-53-100779 | 9/1978 |
| JP | A-5-121702 | 5/1993 |
| JP | A-5-283710 | 10/1993 |
| JP | A-5-343670 | 12/1993 |
| JP | A-7-202046 | 8/1995 |
| JP | A-8-107156 | 4/1996 |
| JP | A-9-92734 | 4/1997 |

* cited by examiner

Primary Examiner—Michael Trinh
(74) Attorney, Agent, or Firm—Oliff & Berridge PLC

(57) ABSTRACT

A method of fabricating a semiconductor device including MOS elements comprising the steps of forming: a gate insulation layer on a semiconductor substrate; forming a gate electrode on the gate insulation layer; and implanting impurity ions into source and drain forming regions, wherein the ion implantation into said source and drain forming regions is performed in separate ion implantation steps. In at least either one of the ion implantation steps for the source forming region or for the drain forming region, a resist layer used for blocking impurities is provided with a wall extending to said gate insulation layer at a location distant from said gate electrode, said wall allowing charges to flow to the substrate. In accordance with the method provided herein, a semiconductor device having excellent data retention characteristics can be provided based on a simple process and without creating additional fabrication steps, while avoiding quality degradation of the tunnel oxide layer or the gate oxide layer resulting from charge-up at the time of ion implantation.

12 Claims, 14 Drawing Sheets

SEMICONDUCTOR DEVICE CONTAINING MOS ELEMENTS AND METHOD OF FABRICATING THE SAME

FIELD OF THE INVENTION

The present invention relates to a semiconductor device and a process for fabricating the same. In particular, the present invention relates to a technique for preventing quality degradation resulting from "charge-up" incurred when impurity ions are implanted into the source or drain forming regions of a semiconductor device.

BACKGROUND ART

It is generally known in the art that, in fabricating a MOS type semiconductor device, a field oxide layer (i,e. LOCOS layer) is first formed on a silicon substrate, followed by depositions of a gate insulation layer and then a gate electrode on top of the gate insulation layer. Subsequently, impurities such as arsenic or phosphorus are ion implanted into a source forming region and a drain forming region of the device.

Also known in the art is a floating gate type, non-volatile semiconductor memory device. Fabricating non-volatile memory cells based on stacked-structure MOS elements typically involves steps of first forming a field oxide layer (LOCOS layer) on a silicon substrate, depositing in succession a tunnel oxide layer and a floating gate in an active region, followed by depositions of an intermediary dielectric layer and a control gate on top of the floating gate, and thereafter implanting impurity ions such as arsenic into a source forming region and a drain forming region of the device.

When ion implantation is performed for either the MOS type semiconductor device mentioned above or a semiconductor device having a multi-layered gate electrode such as the floating gate type non-volatile semiconductor memory device, a resist layer covering the entire wafer is prepared. Such a resist layer has openings only at implanting areas corresponding to where the sources or drains are to be formed, through which ions are implanted while masking the remainder.

However, the prior art fabrication method such as above has presented a problem in that the gate insulation layer is degraded by a phenomenon called "charge-up", when performing an ion implantation into the source or drain forming regions. The ion implantation causes charges to flow through the edges of the resist layer openings into the gate insulation layer, causing such problems as dielectric breakdown or creation of a large amount of electrically neutral electron traps in the gate insulation layer, which causes the threshold voltage to be undesirably high. The problems become more pronounced particularly when the gate insulation layer is thinner. While it is pointed out that these problems may possibly be corrected by high temperature annealing provided after the ion implantation, raising the processing temperature will hinder fabrication of a higher performance LSI.

Moreover, in flash memory cells as exemplified by a stacked-structure EPROM, EEPROM, and the like, charge-up occurring at the time of ion implantation may cause defects in data retention characteristics such as a single-bit charge loss, which has been another cause for concern over quality reliability. Specifically in a non-volatile memory cell, the life of a tunnel oxide layer, i.e. the charge through the oxide Qbd to bring the tunnel oxide layer to breakdown, is lower than the intrinsic charge quantity Qi as determined by factors such as the forming method for the oxide layer, by the amount equivalent to a charge quantity Qp (process-induced charge) that passes through the tunnel oxide layer in the fabrication processes after the formation of the tunnel oxide. As a result, the number of programming/erase operations available for a non-volatile memory cell related to the charge through the oxide Qbd is limited, and degradation (single-bit charge loss) in data retention characteristics may occur.

To overcome such quality degradation problems resulting from charge-up at the time of the ion implantation, a method is proposed wherein the ion implantation is performed after forming an insulating layer on a sidewall portion of the floating gate facing the source (see Japanese Patent Application Laid-open No. 7-202046/1995). However, such a technique requires a separate step of forming the sidewall insulation layer, making the fabrication process more complicated.

SUMMARY OF THE INVENTION

Accordingly, an object of the present invention is to provide a semiconductor device which has excellent data retention characteristics, and a method of fabricating such a semiconductor device by a simple process, without creating additional fabrication steps, while avoiding the gate insulation layer quality degradation resulting from charge-up at the time of ion implantation.

A fabrication method of a semiconductor device containing MOS elements in accordance with the present invention comprises the steps of: forming a gate insulation layer on a semiconductor substrate; forming a gate electrode on the gate insulation layer; and implanting impurity ions into source and drain forming regions, wherein the ion implantation into the source and drain forming regions is performed in separate ion implanting steps, and in at least either one of the ion implantation steps for the source forming region or for the drain forming region, a resist layer used for blocking impurities is provided with a wall extending to the gate insulation layer at a location distant from the gate electrode.

Furthermore, a fabrication method of a semiconductor device including MOS elements in accordance with the present invention comprises the following steps (a) through (h):

(a) a step of forming a gate insulation layer on a semiconductor substrate;

(b) a step of forming a gate electrode on the gate insulation layer;

(c) a step of forming a first resist layer for masking an area other than a first ion implantation area including at least on of a source forming region and a drain forming region, wherein the first resist layer is provided with a wall extending to the gate insulation layer;

(d) a step of forming at least one of a source region and a drain region by implanting impurity ions into the first ion implantation area;

(e) a step of removing the first resist layer;

(f) a step of forming a second resist layer for masking an area other than a second ion implantation area including at least one of a drain forming region and a source forming region;

(g) a step of forming at least one of a drain region and a source region by implanting impurity ions into the second ion implantation area; and (h) a step of removing the second resist layer.

In accordance with the above-mentioned fabrication method, degradation of the gate insulation layer resulting from charges induced at the time of the ion implantation can be prevented by forming a portion of the masking resist layer with a wall extending to the gate insulation layer. Such a wall may be constituted, for example, of an opening formed in the resist layer. In other words, providing, for example, the opening in the resist layer, first, helps suppress accumulation of charges at the gate insulation layer near the gate electrode by allowing the charges built up on the surface of the resist layer to flow to the substrate through the wall constituted of the opening. Second, it helps reduce the amount of charge built up on the surface of the resist layer, which acts as a dielectric body, by lessening the resist layer area compared with the case without such opening. Consequently, the above effects can act to prevent problems associated with degradation of the gate insulation layer resulting from charge-up, such as dielectric breakdown or generation of a large number of electrically neutral electron traps in the gate insulation layer to cause the threshold voltage to be undesirably high, or lowering of the charge through the oxide Qbd to bring the tunnel oxide layer to breakdown.

The resist layer may be formed separately for every individual cells or for every individual blocks each consisting of multiple cells. When the openings for a resist layer are formed continuously in a slit-like shape, this results in a multiple number of split resist layers. Alternatively, the openings of the resist layer may be formed partially and discontinuously in the resist layer. In short, the essential requirement here is an ability to transfer charges at a location distant from the gate electrode through the walls of the openings formed on a resist layer, so that the gate insulation layer near the gate electrode is protected from being adversely affected by the charge-up caused by the ion implantation. As long as the foregoing function is provided, there are no particular limitations on the location or shape of the openings. Furthermore, such openings are not limited to those provided inside the resist layer, but may also include those created by removing the perimeter of a resist layer.

The present invention is particularly effective when the thickness of the gate insulation layer is small, and is most suitable for use in, for example, a MOS element based on a gate insulation layer (gate oxide layer, or tunnel oxide layer) having a thickness of 5 to 15 nm.

The present invention can be applied to fabrication of various semiconductor devices comprising a variety of MOS elements including not only a semiconductor device having the typical MOS element having a gate electrode based on a single conductive layer, but also a semiconductor device comprising a MOS element using a multi-layered gate electrode having a floating gate and a control gate, a semiconductor device comprising both a MOS element having a gate electrode based on a single conductive layer and a MOS element using a multi-layered gate electrode having a floating gate and a control gate, and the like.

A semiconductor device including MOS elements in accordance with the present invention is fabricated by any method provided for in the appended claim 1 through claim 12, specifically, such a semiconductor device comprises: a semiconductor substrate; a source region and a drain region consisting of impurity-diffusion layers formed on the semiconductor substrate; a gate insulation layer formed on the surface of the semiconductor substrate; and a gate electrode formed on the gate insulation layer, and wherein the source region and the drain region comprise impurity-diffusion layers formed in separate ion implantation steps, and at least one or the source region and the drain region has a first impurity-diffusion layer occupying nearly all of the source region or the drain region and a second impurity-diffusion layer occupying a partial area at a position distant from the gate electrode.

In the fabrication process of the present invention, the second impurity-diffusion layer is formed in an ion implantation step using a resist layer as a mask having, for example, an opening, and by introducing impurities into the substrate through the opening.

The semiconductor device of the present invention is best suited for use in semiconductor devices including MOS elements having a thin gate insulation layer, exemplary applications of which include an erasable programmable read only memory (EPROM), an electrically erasable programmable read only memory (EEPROM), a flash EEPROM, an embedded memory based on the aforementioned non-volatile memory, and a programmable logic device (PLD).

PREFERRED EMBODIMENTS OF THE INVENTION

First Embodiment

Figure 1A:
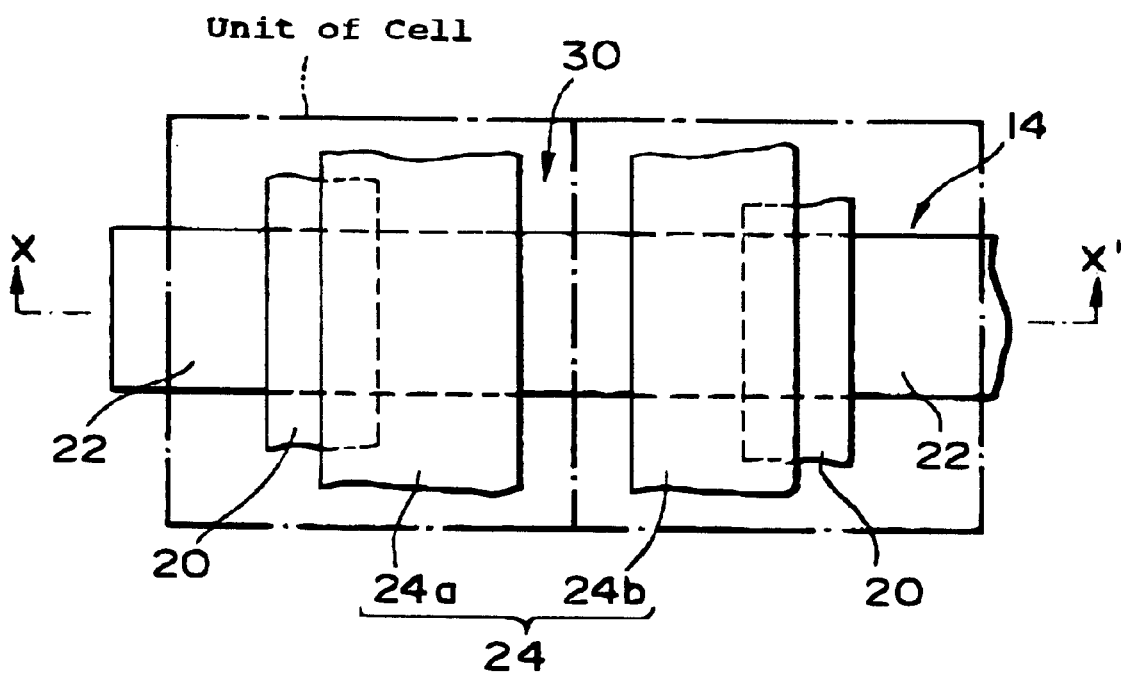
FIG. 1A and FIG. 1B are a plan view and a cross-sectional view, respectively, showing a resist layer configuration for an ion implantation into a source forming region in accordance with a first embodiment.
Figure 1B:
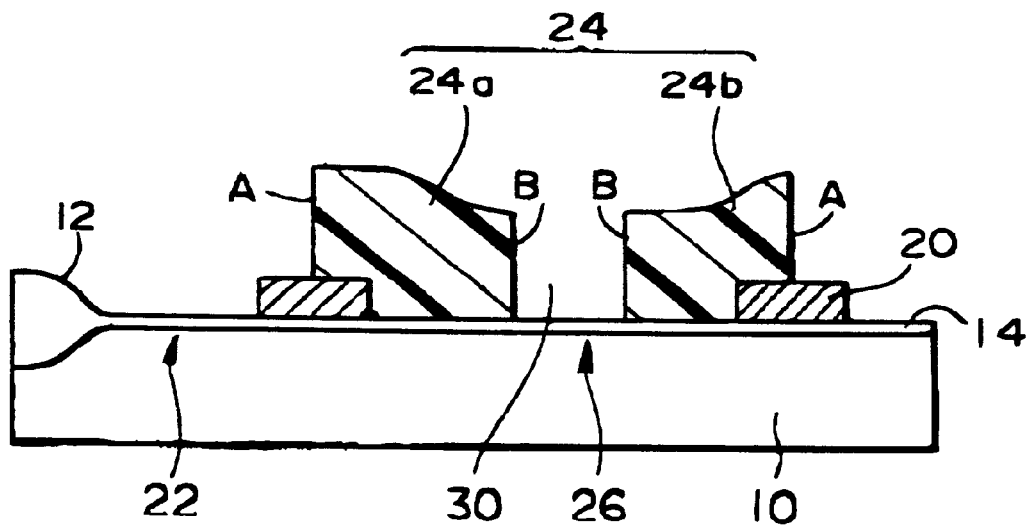

First, descriptions are given concerning an embodiment wherein the present invention is applied to a MOS type semiconductor device based on a single gate electrode. FIG. 1A and FIG. 1B are a plan view showing the resist layer configuration for an ion implantation into a source forming region and a cross-sectional view at the X–X' plane of FIG. 1A; FIG. 2A through FIG. 2E are schematic diagrams illustrating the main fabrication steps in accordance with the present embodiment. Note that FIG. 1A and FIG. 1B correspond to the fabrication step represented in FIG. 2B.

Figure 2A:
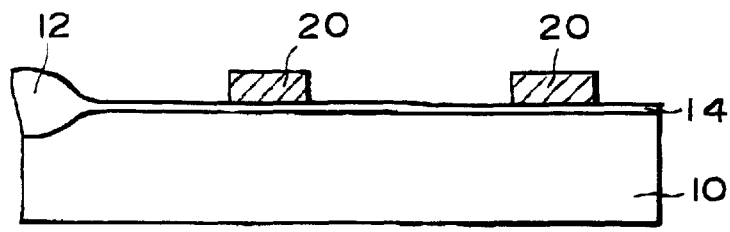
FIG. 2A through FIG. 2E are schematic diagrams illustrating the main fabrication steps of the first embodiment.

Referring to FIG. 2A through FIG. 2E, the relevant fabrication steps are described in sequence as follows:

The first step is to form a field isolation oxide layer 12 in the predefined regions on a p-type silicon substrate 10, followed by forming a gate oxide layer 14 in an active region of the silicon substrate 10 to a thickness of 5 to 15 nm. A layer of polycrystalline silicon is then formed on the gate oxide layer 14, followed by overlaying of a resist layer having required a given masking patterns. The polycrystalline silicon layer is etched and then the resist layer is removed to create a gate electrode 20 (FIG. 2A).

Figure 2B:
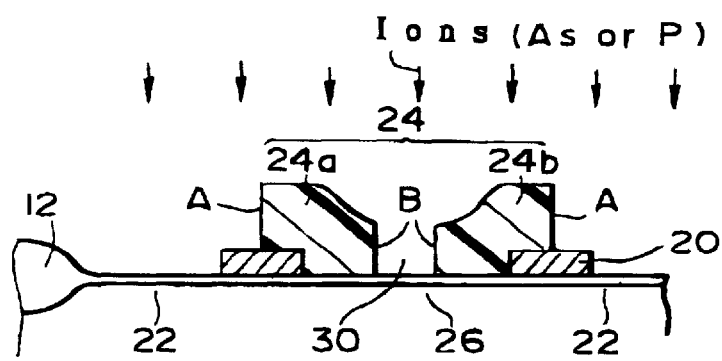

Subsequent to the formation of the gate electrode 20 for each individual cell on the p-type silicon substrate 10 as above, an ion such as arsenic (As) or phosphorus (P) is implanted into a source forming region 22. Prior to the ion implantation in the source forming region 22, a first resist layer 24 having open areas at least at portions corresponding to the source forming region 22 is prepared (FIG. 2B).

In the present embodiment, the first resist layer 24 formed in preparation for an ion implantation into the source forming region 22 is patterned so that the resist layer is separated into every individual cells. More specifically, as illustrated in FIGS. 1A and 1B, the resist layer 24 is shaped so that the source forming region 22 to receive the implant is completely exposed and, at the same time, an opening 30 consisting of walls that extend to the gate oxide layer 14 is formed at a drain forming region 26 and across the border with an adjacent cell. The resist layer 24, in other words, is formed in a manner whereby it is divided into a resist layer 24a and a resist layer 24b for each individual cell, by the opening 30 extending to the gate oxide layer 14 at the drain forming region 26.

Figure 2C:
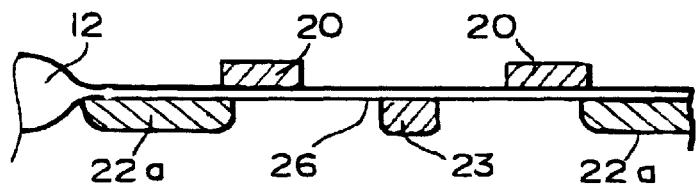

A source region 22a is then formed by an ion implantation of impurities such as arsenic or phosphorus as N-type impurity, and using the resist layer 24 as a mask (FIG. 2C). Since this same step also causes the impurity to be implanted into the silicon substrate 10 through the opening 30, an impurity-diffusion layer 23 (second impurity-diffusion layer) is formed together with a source region 22a, at a portion of the drain forming region 26. After the ion implantation, the above resist layer 24 is removed.

Figure 2D:
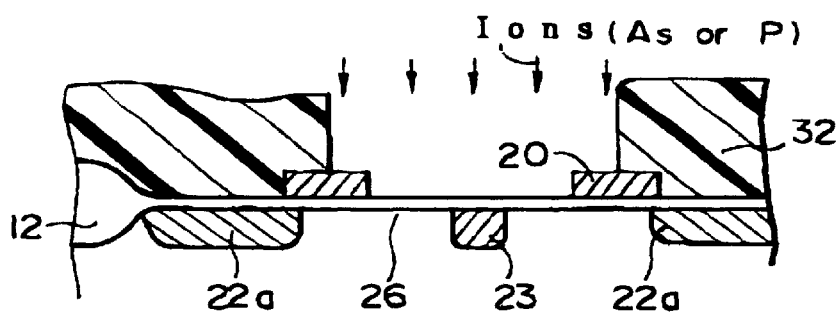
Figure 2E:
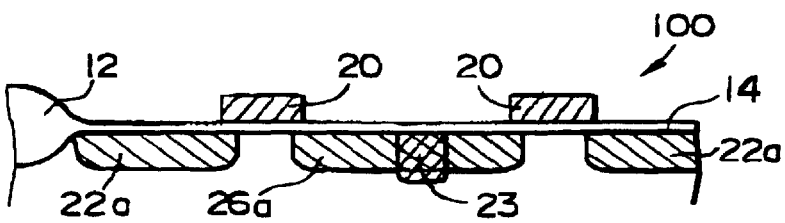

Subsequently, a second resist layer 32 having an open area at the drain forming region 26 is formed (FIG. 2D). After forming the second resist layer 32, an impurity, such as arsenic or phosphorus as an N-type impurity, is ion implanted to form a drain region 26a. As shown in FIG. 2E, the drain region 26a is formed to overlap the impurity-diffusion layer 23 that has previously been doped through the opening 30 of the resist layer 24. As a result the diffusion resistance at the drain region decreases. Since the impurity-diffusion layer 23 is formed at a location sufficiently distant from the gate electrodes 20 it does not adversely affect the transistor performance. Thereafter, removing the second resist layer 32 provides a semiconductor device 100 of the present embodiment (FIG. 2E).

In accordance with this example, the isolated type resist layer 24 (24a, 24b) is formed individually for each cell unit, making the resist layer area considerably smaller than a resist layer that contiguously covers the entire wafer area. This reduces accumulation of charges induced on the resist layer 24 to a relatively small level, resulting in a comparable reduction in the quantity of charges flowing to the gate oxide layer 14 directly underneath the gate electrode 20. Further, since each of the resist layers 24a and 24b has an edge-wall A that contacts to the gate electrode 20 and an edge-wall B constituting the opening 30, the regions where charges are prone to build up tend to be dispersed. Consequently, the quality degradation at the gate oxide layer 14 such as dielectric breakdown or lowering of the charge through the oxide Qbd to bring the tunnel oxide layer to breakdown (hereinafter "charge through the oxide Qbd") is suppressed. Note that in the step illustrated in FIG. 2D, the resist layer 32 may be formed on the impurity-diffusion layer 23 to prevent excessive doping of impurity into the impurity-diffusion layer 23.

Example of Resist Layer Designs

Figure 6A:
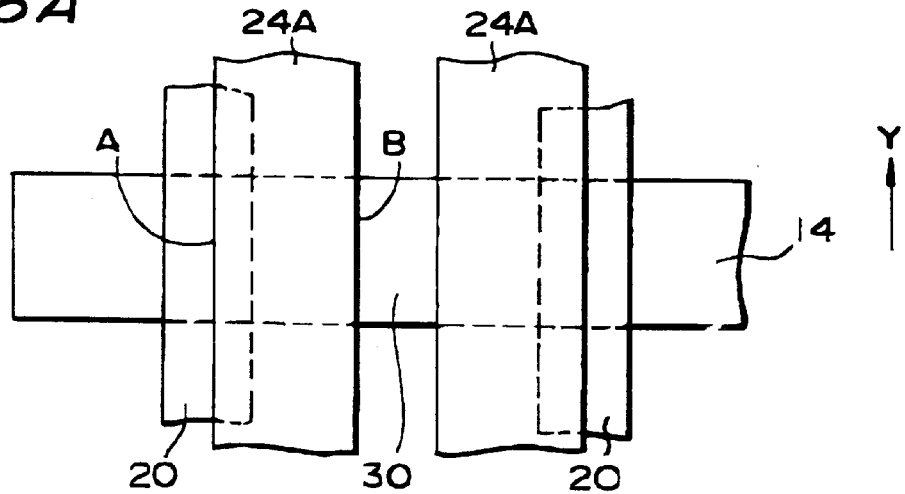
FIG. 6A through FIG. 6C are plan views illustrating various types of resist layers.
Figure 6B:
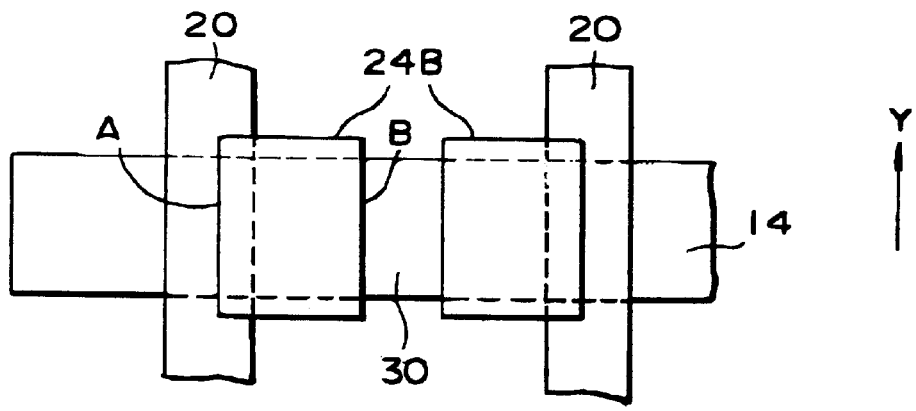
Figure 6C:
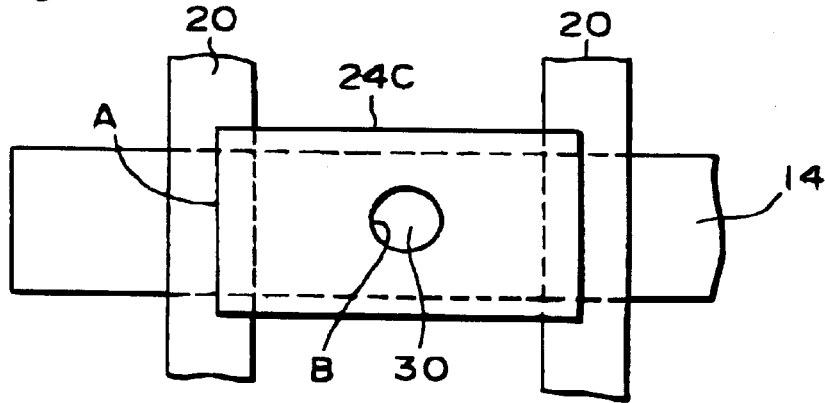

Shown in FIG. 6A through FIG. 6C are examples of resist layer patterns to be formed when an ion implantation into the source forming region 22 is performed. The resist layer 24A shown in FIG. 6A has a pattern structure continuous over the longitudinal direction (Y) of gate electrode 20. In contrast, the resist layer 24B shown in FIG. 6B is designed to have a width approximately equal to or slightly greater than that of the gate electrode 20 in the longitudinal direction (Y).

The resist layer configurations shown in FIGS. 6A and 6B both possess low capacitance at the edge-wall B that constitutes the opening 30, which can act to suppress degradation of a gate oxide layer or tunnel oxide layer in the memory cell by dispersing charges concentrated at the time of the ion implantation. When the above two designs are compared each other, the resist layer 24B shown in FIG. 6B has a comparatively smaller area and therefore allows a smaller accumulation of induced charges than the resist layer 24A shown in FIG. 6A. Therefore, the resist layer 24B is more effective in suppressing the degradation of the gate oxide layer or tunnel oxide layer. Accordingly, it is desirable to prepare isolated type resist layer for each individual cell. Alternatively, resist layers may be formed in units of blocks each consisting of multiple cells.

Furthermore, the opening 30 to be formed in the first resist layer 24 may be of a discontinuous shape in the longitudinal direction of the drain region, in any given geometrical shape such as a circle, rectangle and the like.

A variety of designs is allowed for the resist layer patterns depending on types or designs for the semiconductor device.

Second Embodiment

Figure 3A:
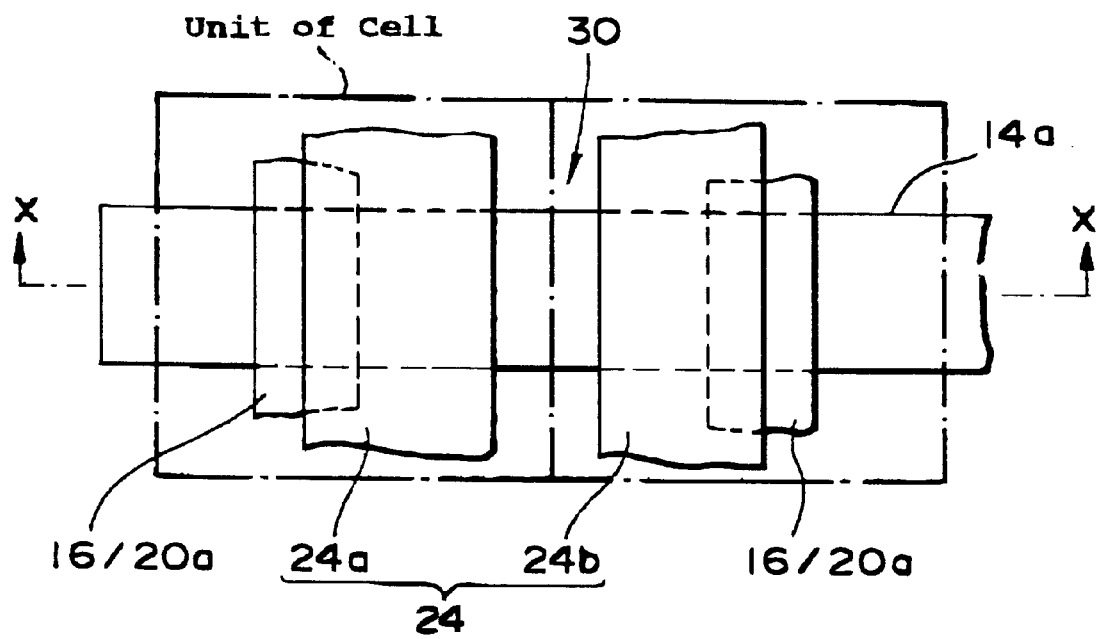
FIG. 3A and FIG. 3B are a plan view and a cross-sectional view, respectively, showing the resist layer configuration for an ion implantation into a source forming region in accordance with a second embodiment.
Figure 3B:
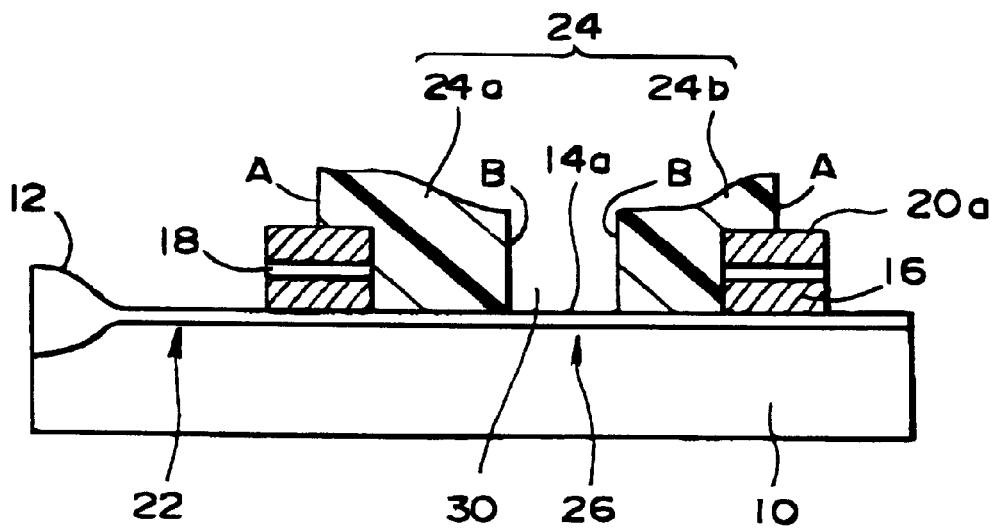
Figure 4A:
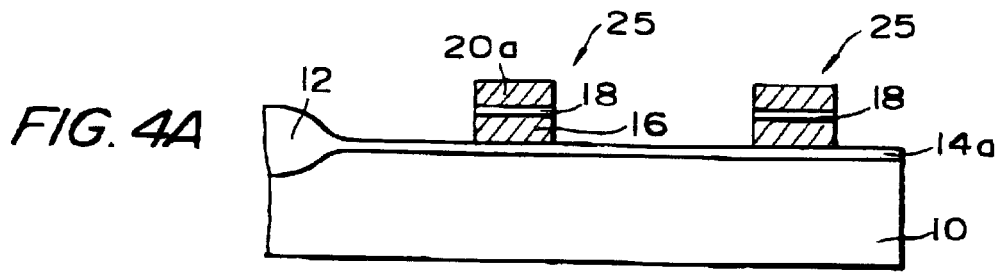
FIG. 4A through FIG. 4E are schematic diagrams illustrating the main fabrication steps of the second embodiment.

Next, an embodiment wherein the present invention is applied to a flash memory device based on stacked-structure MOS elements is explained in detail referring to the drawings provided herein. FIG. 3A and FIG. 3B are a plan view and a cross-sectional view at the X–X' plane of FIG. 3A, respectively, showing a resist layer configuration when ion implanting a source forming region. FIG. 4A though FIG. 4E are schematic diagrams illustrating the main fabrication steps of the present embodiment.

Referring to FIG. 4A, the first step of fabricating a stacked-structure flash memory cell is to form a field isolation oxide layer 12 on a p-type silicon substrate 10, followed by forming a tunnel oxide layer 14a in an active region of the silicon substrate 10, to a thickness around 50 to 120 nm. On top of the tunnel oxide layer 14 and the field isolation oxide layer 12, a first polycrystalline silicon layer is deposited to form a floating gate 16. Next, an intermediary dielectric layer (ONO layer) 18 comprising either a single oxide layer or a three-layered, oxide-nitride-oxide (ONO) layer is formed on the surface of the polycrystalline silicon layer using a chemical vapor deposition (CVD) or a thermal oxidation method. Examples of the above-mentioned oxide layers include silicon dioxide ($SiO_2$) layer, SiOF, and the like; for nitride layers, silicon nitride, silicon oxinitride, and the like can be mentioned.

Subsequently, a second polycrystalline silicon layer is superimposed on the surface of an intermediary dielectric layer 18 to form a control gate 20a, followed by overlaying of a resist layer having a given masking pattern. The polycrystalline silicon layer is etched using the resist layer as a mask which is then removed to form a stacked-structure gate electrode 25 (FIG. 4A).

Thus, a gate electrode 25 consisting of the floating gate 16, the intermediary dielectric layer 18, and the control gate 20a is formed for each individual cell on the p-type silicon substrate 10. Subsequent to the foregoing step, an impurity such as arsenic (As) or phosphorus (P) is ion implanted into a source forming region 22. Prior to the ion implantation into the source forming region 22, however, a first resist layer 24 having open areas at least at portions corresponding to the source forming region 22 is formed. In the present embodiment, the resist layer 24 is formed with isolated patterns for each individual cell, as shown in FIGS. 3A and 3B.

Figure 5A:
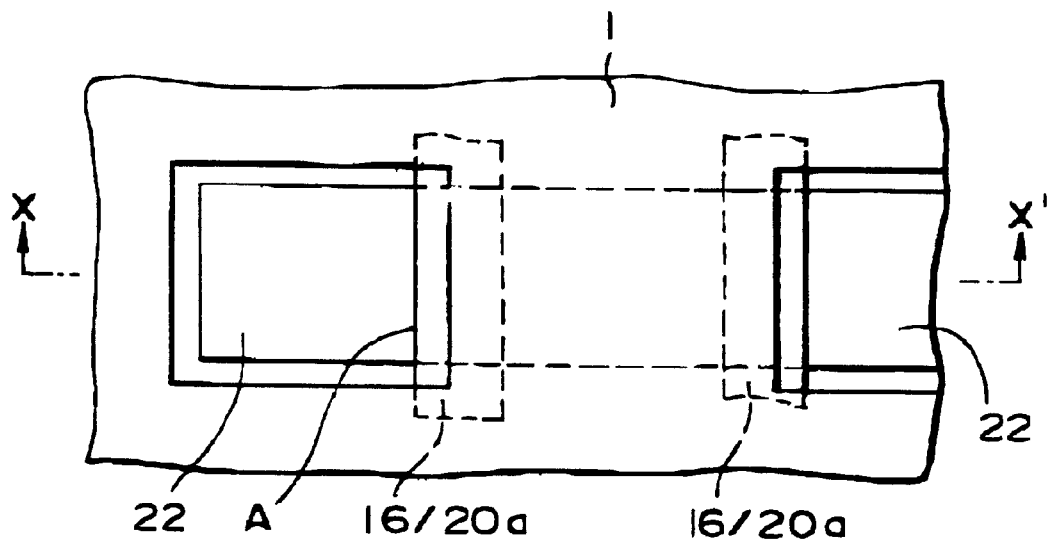
FIG. 5A and FIG. 5B are a plan view and a cross-sectional view, respectively, showing the resist layer configuration for an ion implantation into a source forming region, according to the fabrication method as a comparative example.
Figure 5B:
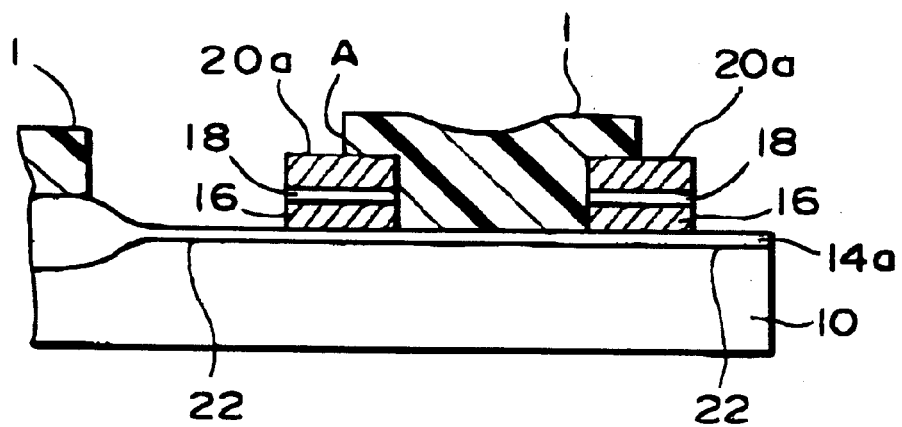

To better illustrate the need for forming the resist layer in such an isolated manner, an implanting method as a comparative example is shown in FIGS. 5A and 5B. In this example, a resist layer 1 is formed to cover the entire wafer surface, and then patterned to have openings only at the regions where the sources are to be formed while having the remaining portion act as an ion shielding layer Since this structure contains a series-connected capacitance comprising the tunnel oxide layer 14a and the intermediary dielectric layer 18, the charges accumulated an the surface of large resist layer 1 area, during the time of ion irradiation are apt to shift through the edge-wall A at the opening of the resist layer 1 and accumulate on the floating gate 16 and the control gate 20a. The accumulated charges then flow to the tunnel oxide layer 14a directly underneath the floating gate 16, leading to a reduced charge through the oxide Qbd or a dielectric breakdown at the tunnel oxide layer 14a. As a result, the number of programming/erase operations available for the flash memory cell is reduced and the data retention characteristics deteriorate with defects such as a single-bit charge loss.

In the present embodiment, therefore, the resist layer 24 formed when the ion implantation into the source forming region 22 is performed, is patterned so that each individual cell is isolated. More specifically, as illustrated in FIGS. 3A and 3B, resist layer 24 is shaped so that the source forming region 22 to be ion implanted is completely exposed and, at the same time, a slit-shaped opening 30 having walls that extend to the tunnel oxide layer 14a is formed at the drain forming region 26 and across the border with an adjacent cell. The resist layer 24, in other words, is formed in a manner whereby it is divided into the resist layer 24a and the resist layer 24b for each individual cell, by the opening 30 extending to the tunnel oxide layer 14a at the drain forming region 26.

The resist layer 24 (24a, 24b) is formed to have a rectangular planar shape arranged so that the edge-wall A of the opening area corresponding to the source forming region 22 to receive the implanted ion and the edge-wall B in contact with to the tunnel oxide layer 14a at the opening 30 are parallel to each other, while the other pair of edges are in contact with the field oxide layer 12.

Figure 4B:
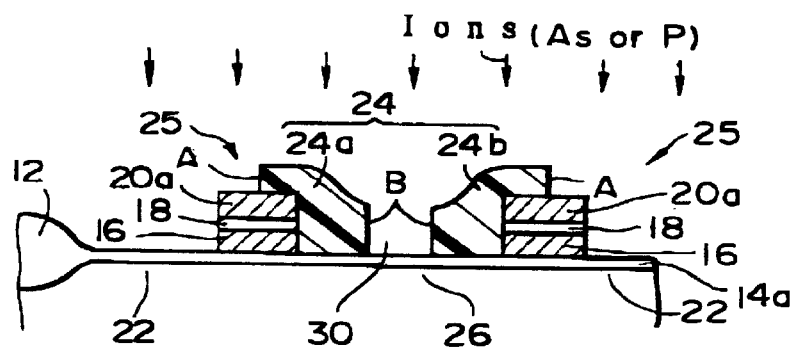

Following the above step, implantation of an arsenic (As) or a phosphorus (P) ion implant is performed to form a source region on the silicon substrate 10, as shown in FIG. 4B, under conditions, for example, at an acceleration energy of 35 to 100 keV and a dosage of $1E14/cm^2$ to $5E15/cm^2$.

Figure 4C:
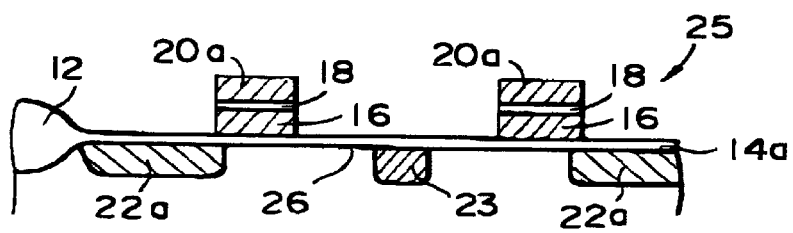

A source region 22a of an N-type diffusion layer, as shown in FIG. 4C, is then formed by providing heat treatment after removing the resist layer 24 from the silicon substrate 10. Since this ion implantation also causes the impurity to be implanted into the silicon substrate 10 through the above opening 30, an $N^+$ type impurity-diffusion layer 23 (second impurity-diffusion layer) is also formed at a portion of the drain forming region 26.

Subsequently, a second resist layer 32 having an open area at the drain forming region 26 is superimposed. To differ with first embodiment discussed previously, this resist layer 32 is formed in such a way that its periphery is not extended to reach the field oxide 12 (FIG. 4D) but its outer sidewall (edge-wall B) reaches the tunnel oxide layer 14a in the source forming region 22a. An edge-wall B constituting the second resist layer 32 such as above can serve the same function as the edge-wall B at the opening 30 in the first resist layer 24 shown in FIG. 4B, and therefore can be deemed to be an opening 40 in the second resist layer 32 formed on tunnel oxide layer 14a.

Figure 4D:
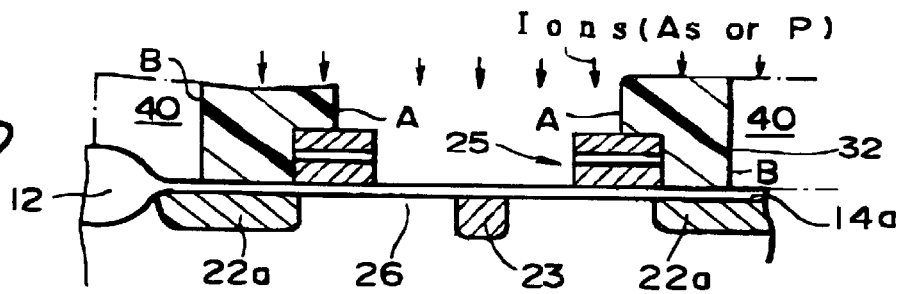
Figure 4E:
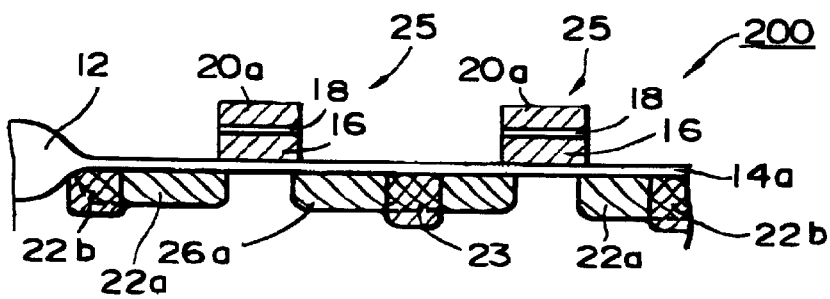

Following the above step, an arsenic (As) or a phosphorus (P) ion implantation is performed to form a drain region 26a on the silicon substrate 10 under conditions, for example, at an acceleration energy of 35 to 50 keV and a dosage of $1E15/cm^2$ to $1E16/cm^2$ (FIG. 4D).

After the above implantation into the drain forming region 26 and removal of the second resist layer 32 from the silicon substrate 10, a drain region 26a of an $N^+$-type diffusion layer is formed by performing heat treatment, as shown in FIG. 4E.

The above drain region 26a is formed to overlap impurity-diffusion layer 23 that has previously been doped through the opening 30 of the first resist layer 24. Similarly, an impurity-diffusion layer 22b, doped through the opening 40 of the second resist layer 32, is also formed in the source region 22a. As a result, the diffusion resistance at the drain and source regions decreases. Since the impurity-diffusion layers 23 and 22b are formed at a location sufficiently distant from the gate electrode 25, this does not adversely affect the transistor performance. For processing thereafter, conventional steps can be adopted.

Note that in the step illustrated in FIG. 4D, the resist layer 32 may be prepared also on the $N^+$ type impurity-diffusion layer 23 to prevent excessive implantation of the ion into the $N^+$ type impurity-diffusion layer 23.

In accordance with the process steps described in the foregoing, a semiconductor device 200 including stacked-structure MOS elements, such as a flash memory cell, can be provided.

In the present embodiment, for the purpose of performing the ion implantation into the source forming region 22, the first resist layer 24 is formed individually for each cell unit without contiguously covering the whole wafer area, thus allocating a smaller area for the resist layer. This limits the accumulation of charges induced on the resist layer 24 to a relatively small quantity, resulting in a comparable reduction in the quantity of charges flowing through the tunnel oxide layer 14a directly underneath the floating gate 16. Consequently, the quality degradation at the tunnel oxide layer 14 such as dielectric breakdown or lowering of the charge through the oxide Qbd is suppressed. Further, since each of the first resist layers 24a and 24b has an edge-wall A contacting with the control gate electrode 20a and an edge-wall B constituting the opening 30, the design of the present embodiment helps disperse the regions where charges are prone to concentrate.

To elaborate on the above point, a series-connected capacitance is formed by the stacked-structure gate electrode 25 at the edge-wall A on one side of the first resist layers 24a and 24b. By contrast, the edge-wall B on the other side constitutes a single capacitance which therefore has less dielectric strength than that of the edge-wall A. Thus, charges generated up on the first resist layers 24a and 24b tend to flow along the edge-wall B constituting the opening 30, better than along the edge-wall A, making the quantity of charges flowing through the tunnel oxide layer 14a directly underneath the floating gate 16 relatively small. This helps prevent the reduction of the charge through the oxide Qbd at the time of the ion implantation into the source forming region 22 and therefore suppresses the degradation of the tunnel oxide layer 14a. As a result, the number of available programming/erase operations and its data retention characteristics can be improved to provide better reliability for a flash memory cell.

The aforementioned applies equally to the second resist layer 32 used for ion implanting the drain forming region 26 as shown in FIG. 4D The present embodiment differs from the first embodiment in that it applies the method of the present invention to both the first and second resist layers. Applying the method of the present invention to ion implanting steps for both the source forming and drain forming regions provides for more reliable suppression of adverse effects from charge-up associated with ion implantation than is made available from application of the method to either one of the implanting steps.

Furthermore, the present embodiment allows an alternative configuration wherein, in a manner similar to the first embodiment, only the first resist layer has the opening 30 and an opening is not provided in the second resist layer. In other words, an effect to prevent the reduction of the charge through the oxide Qbd is obtained when at least one of the opening 30 or the opening 40 is provided in either of the processes of forming the source region or the drain region When only one opening is being provided for either of the two region forming processes, in particular, for a flash memory cell programmed with Fowler-Nordheim tunneling for exchanging electrons at the source region side, it is more desirable to prepare the opening 30 at the time of forming the source region. Such configuration ensures avoidance of reduction of the charge through the oxide Qbd at the tunnel oxide layer 14a at the edges of the floating gate and the source region, caused as a result of charge-up damage occurring at the time of the ion implantation.

Third Embodiment

Figure 7A:
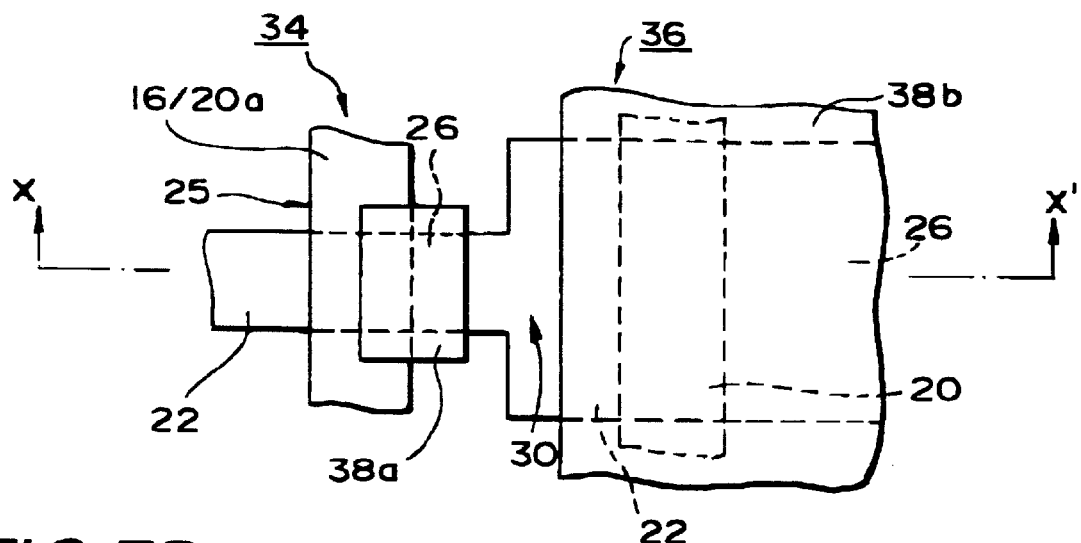
FIG. 7A and FIG. 7B are a plan view and a cross-sectional view, respectively, showing the resist layer configuration for an ion implantation into a source forming region in accordance with a third embodiment.
Figure 7B:
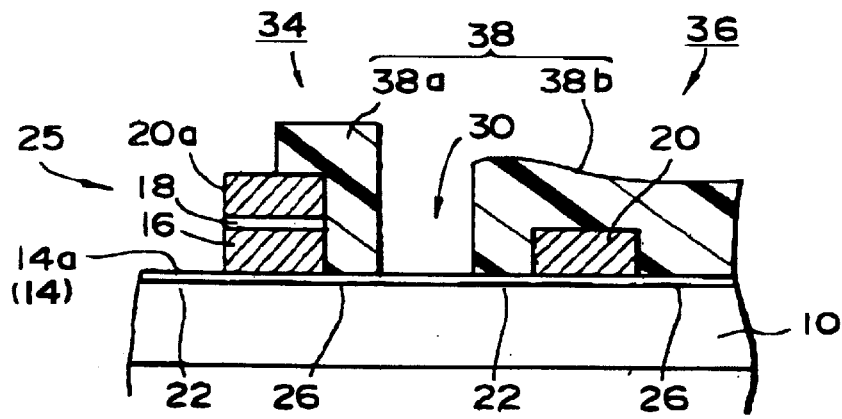
Figure 7C:
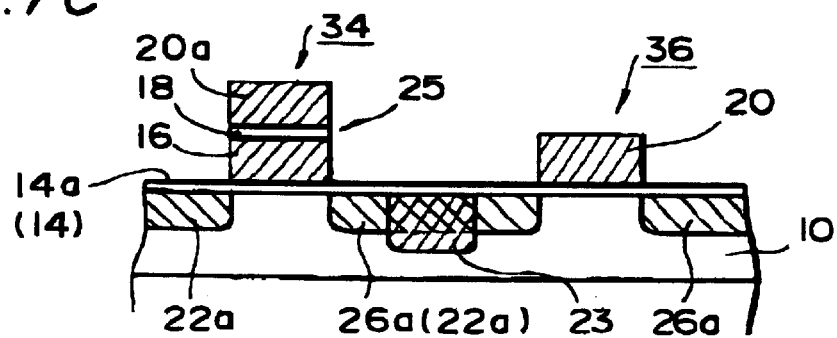
FIG. 7C is a cross-sectional view of a flash memory cell according to the third embodiment.

Referring to FIG. 7A through FIG. 7c, the third embodiment is described next. In the present embodiment, the present invention is applied to a two-transistor flash memory cell having a pair of transistors in a single cell. FIG. 7A and FIG. 7B are a plan view and a cross-sectional view, respectively, showing the resist layer configuration for an ion implantation into a source forming region, and FIG. 7C is a cross-sectional view of a flash memory cell according to the present embodiment.

The flash memory cell of the present embodiment comprises a storage transistor region 34 and an access transistor region 36. With reference to FIG. 7A through FIG. 7C, members and positions essentially identical to those in the aforementioned second embodiment are shown with the same reference numerals and their detailed descriptions are omitted.

When the source forming region 22 is ion implanted in the present embodiment, as shown in FIGS. 7A and 7B, the resist layer 38 (38a, 38b) masks at least a part of the drain forming region 26 in the stacked-structure storage transistor region 34, and nearly all of the access transistor region 36. In other words, in the storage transistor region 34, the isolated type resist layer 38a leaves the source forming region 22 completely open for ion implantation while masking the drain forming region 26 other than the opening 30 formed between itself and the adjacent access transistor region 36. Meanwhile, in the access transistor region 36, the resist layer 38b masks the region excluding the area for the opening 30.

As with the second embodiment discussed previously, the present embodiment can also prevent the reduction of charge through the oxide Qbd or dielectric break down of the tunnel oxide layer 14a in the stacked-structure storage transistor region 34, caused by charges concentrated at the time of the ion implantation. As a result, performance such as the number of programming/erase operations available or data retention characteristics can be improved.

Fourth Embodiment

In the following paragraph, a semiconductor device based on a memory cell with a configuration similar to the two-transistor flash memory cell shown in FIG. 7C is described. The principal contents of the technology of this particular semiconductor device have been disclosed in an international application filed by the present inventors, applied for under the Patent Cooperation Treaty with the International Application No. PCT/U.S. Ser. No. 97/10448. The main portion of the application document is recapitulated hereunder referring to FIG. 8 through FIG. 12. As will be described later in detail, the fabrication method of the present invention can be applied to the fabrication process of the above semiconductor device to accomplish effects similar to those described in the foregoing.

Figure 8:
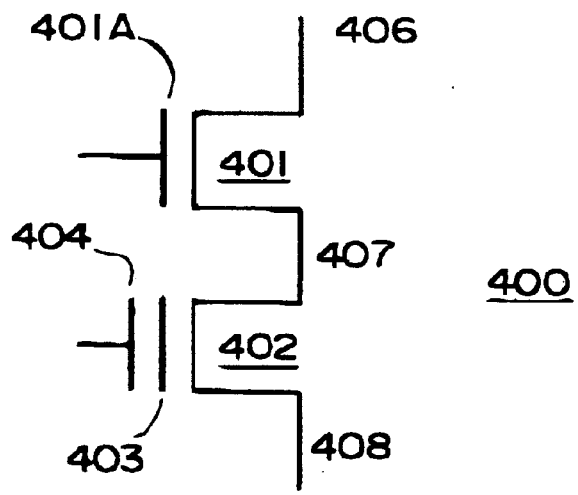
FIG. 8 is a diagram illustrating an equivalent circuit of a flash memory cell according to a fourth embodiment.

In accordance with the present invention, FIG. 8 illustrates a schematic view of a flash memory cell 400 having an access transistor 401 and a storage transistor 402. The Access transistor 401 has a gate 401A, whereas the storage transistor has a floating gate 403 and a control gate 404. In the present embodiment, the access transistor 401, an N-channel MOSFET, has a threshold voltage of approximately 0.7 volts.

Programming of the memory cell 400 is achieved by simultaneously applying a high positive programming voltage Vpp, typically about 12 volts, to the gate 401A of the access transistor 401 and to the control gate 404 of storage transistor 402, holding a source 408 of the storage transistor 402 at ground potential Vss, and applying a positive programming pulse to a drain 406 of the access transistor 401.

Figure 9:
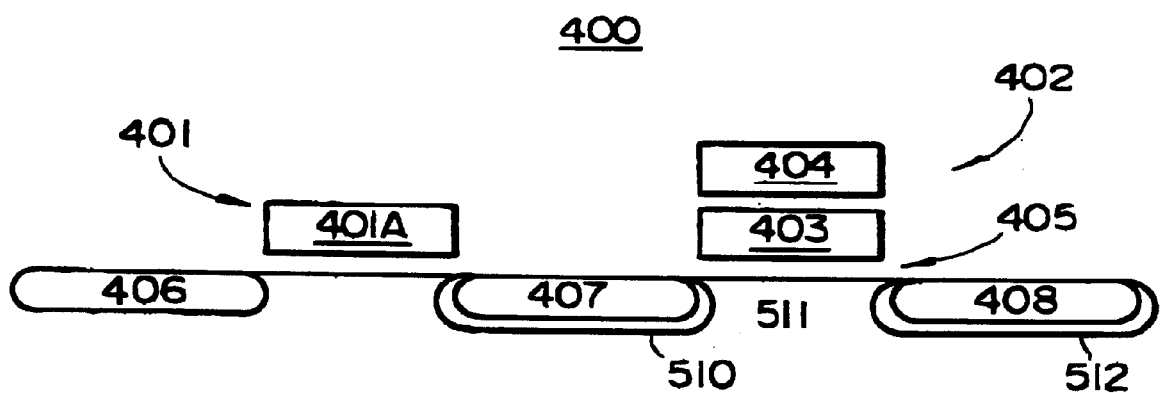
FIG. 9 is a cross-sectional view showing the flash memory cell as show in FIG. 5.

In one example, a programming pulse of about 5 volts is provided for 100 micro seconds. Referring to FIG. 9, the drain 407 of the storage transistor 402 (also the source of the access transistor 401) is formed with a high substrate doping 510 (explained in detail in reference to FIG. 12F). This drain implantation enhances the electric field in the area of the channel region 511 close to the drain 407, thereby accelerating the conduction electrons and generating a distribution of high energy electrons that are energetic enough to overcome the potential energy barrier for transfer over a thin oxide layer 405 and into the floating gate 403 (i.e. hot electron injection). This highly doped drain implant improves the speed of programming by an order of magnitude. Note that the access transistor 401 takes up a smaller fraction of the applied drain pulse voltage, since the width of access transistor 401 is typically in the range of 2.0 to 5.0 μm, compared to 0.5 to 1.5 μm for the storage transistor 402

Erasing of the memory cell 400 is accomplished by applying a high positive voltage Vpp to source 408 of the storage transistor 402, while holding the control gate 404 to ground potential Vss. A high electric field is generated a cross a thin oxide 405 (FIG. 9), thereby allowing the electrons collected on the floating gate 403 to overcome the potential energy barrier and tunnel (i.e. Fowler-Nordheim tunneling) through the thin oxide 405 to the source 408 of the storage transistor 402, During erasing, the gate 401A is held at ground and a drain 406 is left floating.

Figure 12A:
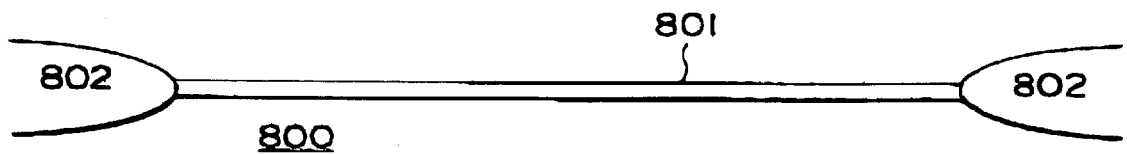
FIG. 12A through FIG. 12G show the steps to fabricate the flash memory cell as shown in FIG. 5 and FIG. 9.
Figure 12B:
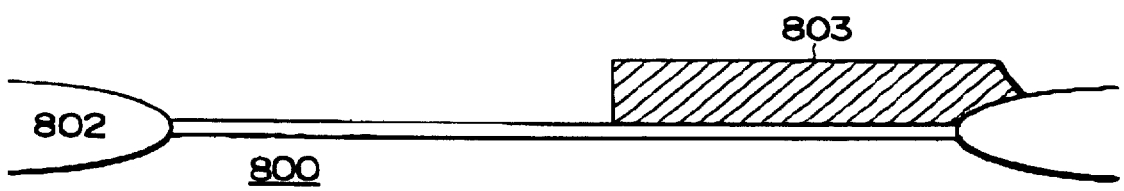
Figure 12C:
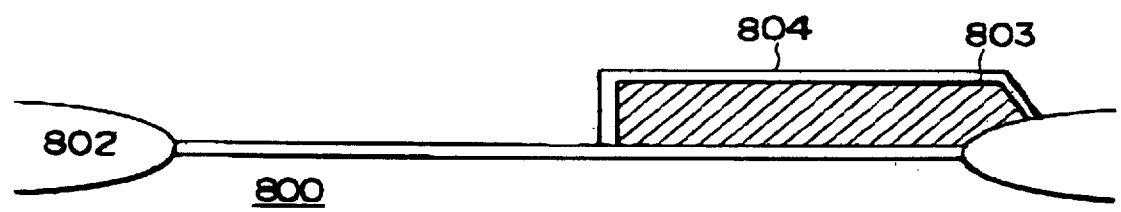
Figure 12D:
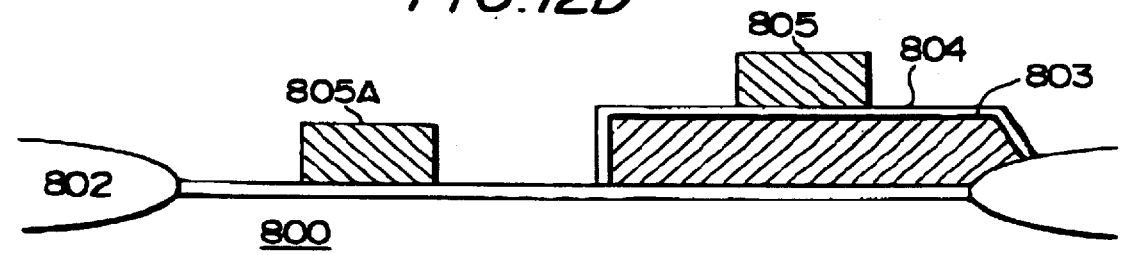
Figure 12E:
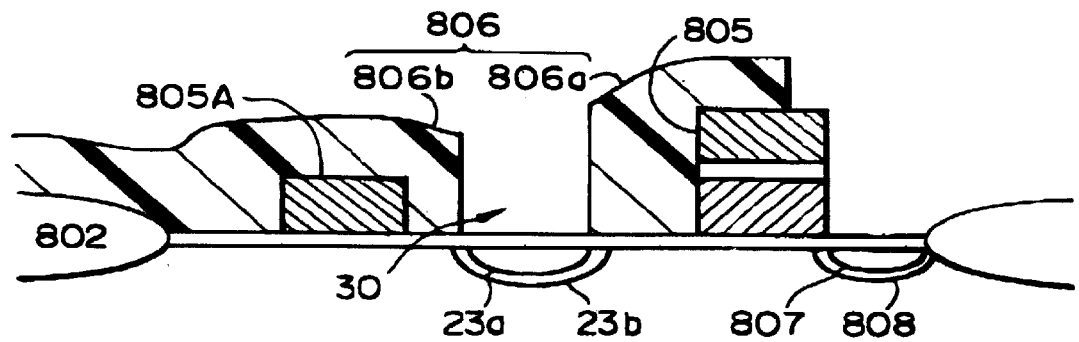
Figure 12F:
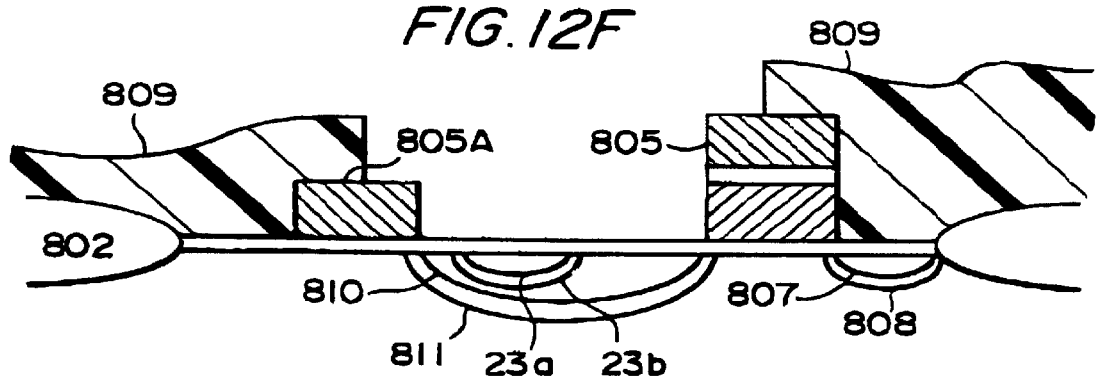
Figure 12G:
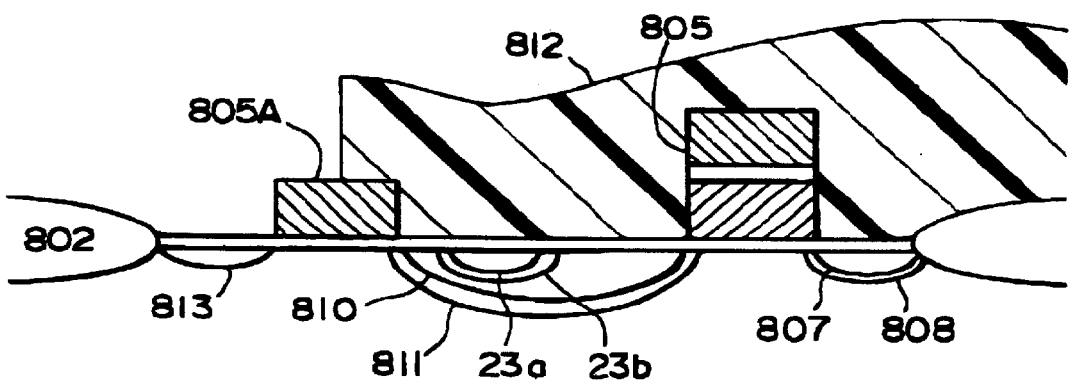

The source 408 of the storage transistor 402 is also formed with a high substrate doping 512 (explained in detail in reference to FIG. 12E). This high substrate doping increases the breakdown of the junction, thereby significantly accelerating the transfer of the conduction electrons of f the floating gate during erasing. In this manner, during an erase operation, the storage transistor 402 erases to the point that its threshold voltage is negative. Thus, the storage transistor 402 cannot be turned off by the control gate 404. However, the access transistor 401 prevents this overerasure from affecting cell performance. Specifically, the threshold voltage of the access transistor 401 remains approximately 0.7 volt.

Figure 10:
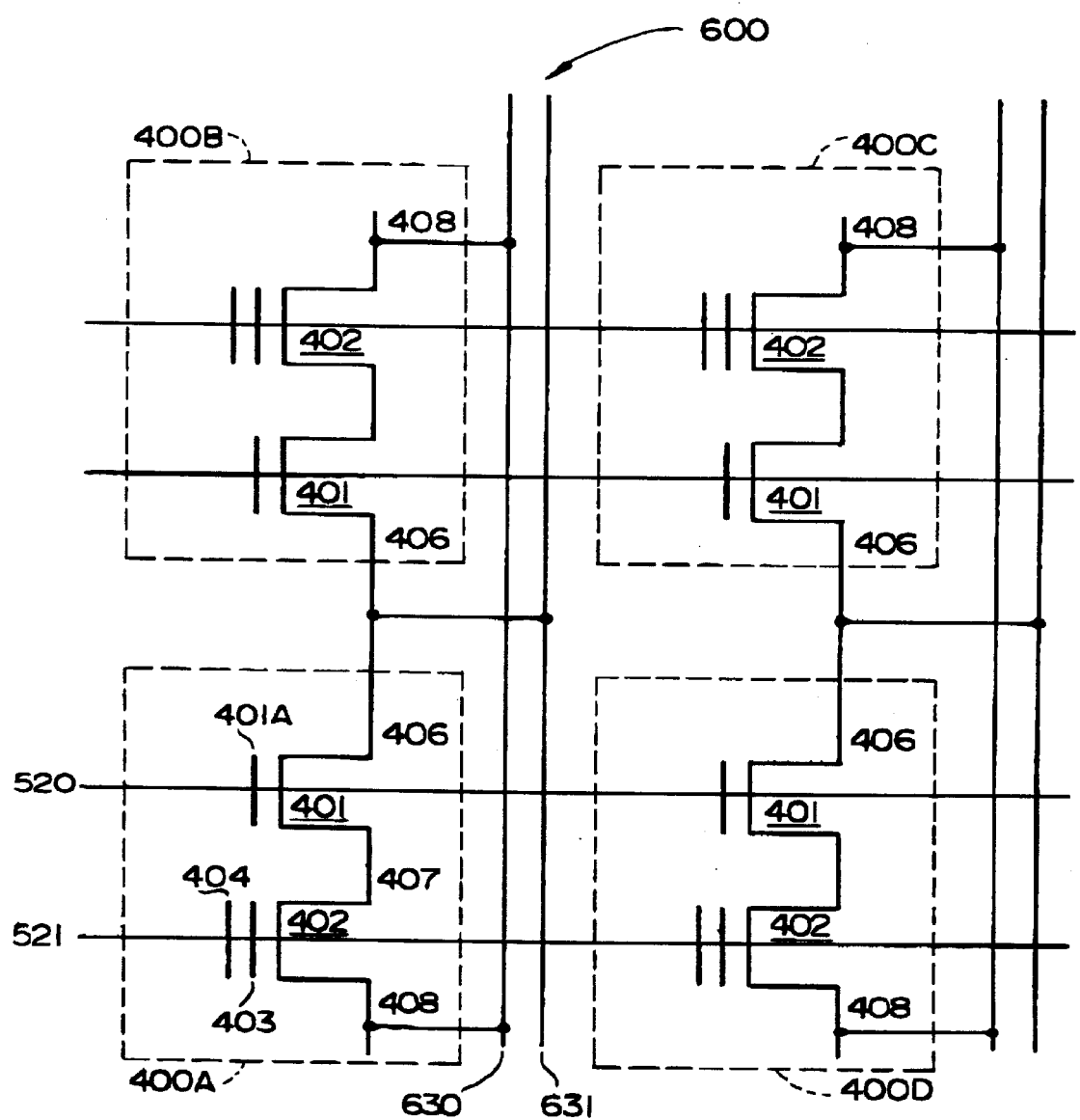
FIG. 10 is a schematic diagram illustrating an array using the flash memory cells as shown in FIG. 8 and FIG. 9.

FIG. 10 shows an illustrative memory array 600 which includes memory cells 400A to 400D, wherein each memory cell is identical to the memory cell 400 (FIG. 8). The drains 406 of the access transistors 401 (of the cells 400A and 400E) are coupled to a metal drain bitline 631, whereas the sources of storage transistors 402 (also of cells 400A and 400B) are coupled to a metal source bitline 630. Note that the gates 401A of the access transistors 401 of the cells 400A and 400D are coupled to a wordline 520, whereas the control gates 404 of the cells 400A and 400D are coupled to a control line 521.

Referring to FIG. 9, reading of a cell 400, for example cell 400A, is accomplished by applying a standard Vcc voltage (typically 5 volts) to the gate 401A via wordline 520 and to the control gate 404 via control line 521, while simultaneously sensing the read current through the cell 400A by a conventional sense amplifier (not shown) connected to the drain bitline 631. If the cell 400A is erased i.e. has a zero or net positive charge condition on floating gate 403), both the transistors 401 and 402 are turned on, thereby allowing a current to flow that can be sensed by the sense amplifier. If the cell 400A is programmed (i.e. has a net negative charge on floating gate 403), the threshold voltage of the storage transistor 402 is increased above the supply voltage Vcc, thereby preventing current flow through the cell 400A.

In this configuration, the sense amplifier which receives voltage on the drain bitline generates a feedback voltage to the source bitline 630, thereby increasing voltage on the source bitline 630 during a read operation. In this manner, the drop of voltage on the drain bitline 631 is slowed down. Consequently, the present invention significantly reduces the time for the bitlines to recover to their original state to perform sensing during the next logic state cycle compared to the prior art memory cell arrays.

The main limitation to scaling of the storage transistor 402 is the punch through requirement. Due to capacitive coupling between the drain region 407 and the floating gate 403, the storage transistor 402 typically turns on by coupling to the drain region 407. This capacitive coupling limits the scalability of channel length 511 (FIG. 9) and thereby also limits improvement in programming speed necessary for the 5V programming capability. Specifically capacitive coupling from the drain region 407 to the floating gate 403 degrade the punch through margin of storage transistor 402. The storage transistor 402 is partially turned on by the voltage induced onto the floating gate 403 from the drain 407, thereby limiting the drain voltage handling capability of the storage transistor 402. The capacitive coupling effect does not scale with the gate line width of the storage transistor 402 due to the strong effect of fringing capacitance, i.e. The capacitance other than parallel plate capacitance. Therefore, the effect of this drain coupling actually becomes more dominant for smaller geometries and is a serious scaling limitation to conventional EEPROM and flash cells without an access gate. Note that the speed of programming increases exponentially with the inverse of the effective channel length.

The present embodiment solves this scaling problem by including the access transistor 401 (FIG. 9) in the cell 400. Because the present embodiment eliminates punch through on the storage transistor 402 in the programming mode, the channel length 511 can be scaled. This scalability feature allows the channel length 511 to be decreased, thereby significantly increases the programming speed of the memory cell ill comparison to the prior art Moreover, by further including a doping in the drain 407, the cell 400 achieves a full 5V programming capability.

Figure 11:
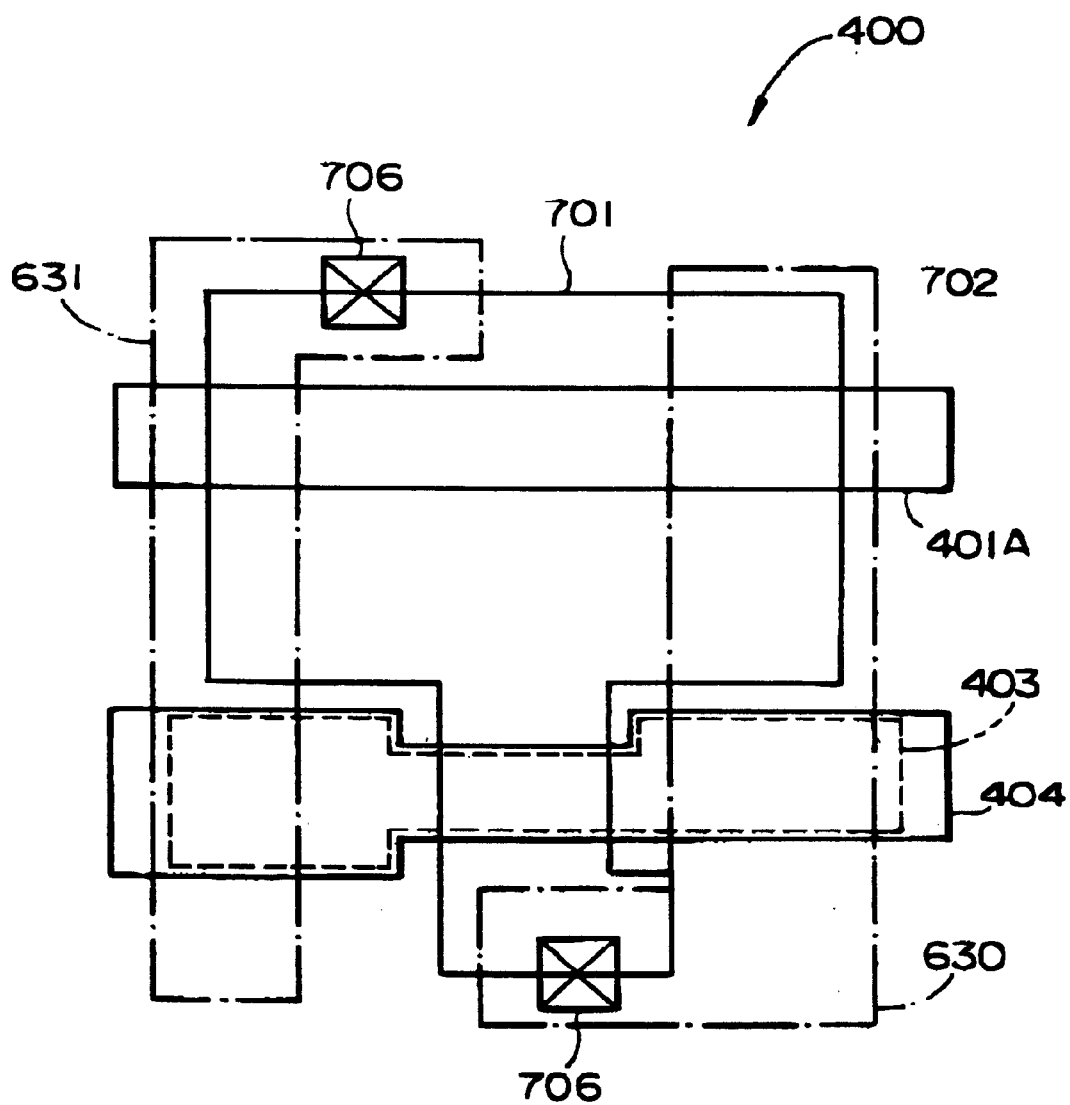
FIG. 11 illustrates a layout of the flash memory cell as shown in FIG. 8 and FIG. 9.

FIG. 11 illustrates one embodiment of a layout for the memory cell 400 including an active diffusion area 701 surrounded by an isolation area 702 The isolation area 702 typically comprises a thick isolation oxide to prevent conduction between adjacent memory cells. A floating gate 403 is self-aligned with a control gate 404 (as described in detail in a reference to FIG. 12E) The gate 401A is formed from the same conductive layer used to form the control gate 404. After definition of the gates 401A, 403, and 404, the junction area is implanted with appropriate dopants to form conventional n-type junctions as well as the source and drain junction implants of the present invention (explained in detail in reference to FIGS. 12E and 12F). Finally, after conventional oxidation steps, the contact holes 706 are etched, and the metal source line 630 and the metal drain line 631 are both deposited and etched.

FIGS. 12A to 12G illustrate the steps to provide one example of a memory cell in accordance with the present embodiment. Note that conventional steps and methods are well known to those skilled in the art, and therefore are not described in detail herein. Referring to FIG. 12A, a field isolation region 802 is formed in a substrate 800. Subsequently, a tunnel oxide layer 801 is grown on the exposed area of the substrate 800 to a thickness of between 8 nm to 13 nm. FIG. 12B shows that a layer 803 of polysilicon is then deposited and patterned to form the floating gate of the storage transistor The layer 803 is typically deposited to a thickness of between 80 nm to 170 nm, and is doped using an N-type dopant, such as Phosphorus Oxychloride (POCl,).

Alternatively, another Phosphorous or an Arsenic implant is performed at an energy of 20 to 40 keV and a dosage of $5E14/cm^2$ to $5E15/cm^2$. An oxide-nitride-oxide (ONO) layer is then provided on the above-described structures. Specifically, an oxide layer is grown on the structures to a thickness between 10 nm and 20 nm using a thermal oxidation method. A silicon nitride layer is then deposited on the oxide layer to a thickness between 10 nm to 20 nm. A final oxide layer is grown to a thickness between 3 nm and 5 nm on the silicon nitride layer using a wet oxidation method. A resist layer (not shown) is used to ensure that the resulting an ONO layer 804 is removed except for the storage transistor area, i.e. so that the ONO layer 804 is formed only on the layer 803 as shown in FIG. 12B. This removal typically comprises consecutive steps of wet etching, isotropic etching, and wet etching to reduce any etching damage to the substrate.

Subsequently, the gate oxide of the access transistor is grown on the exposed area of the substrate to a thickness of 5 nm to 25 nm.

As shown in FIG. 12D, a control gate 805 for the storage transistor and a gate 805A comprise polysilicon or polycide deposited to a thickness between 250 nm and 400 nm. Polycide may include polysilicon (100A to 200A) in combination with one of the following suicides: tungsten silicide (wSi$_2$), molybdenum silicide (MoSi$_2$), titanium silicide (TiSi), or cobalt silicide (CoSi$_2$) (100 nm to 200 nm) The gates 805 and 805A are then doped using an N-type dopant, such as Phosphorus Oxychloride (POCl$_8$), or alternatively, another Phosphorous or an Arsenic implant is performed at an energy of 20 to 40 keV and a dosage of $2E15/cm^2$ to $6E15/cm^2$.

Subsequently, the gates 805 and 805A are patterned as shown in FIG. 12E Using a conventional anisotropic etching method including photoresist, the layers 803 and 804 are then etched. In another embodiment, a layer of oxide is formed on the top of the gates 805 and 805A to a thickness between 200 nm and 300 nm, then another conventional anisotropic etch is performed. Etching using oxide as the etching mask minimizes critical dimension (CD) loss and results in increased control of the shape of the edge of the electrode. In either method, the control gate 805 and the floating gate 803 of the to-be-formed storage transistor are self-aligned as shown in FIG. 12E. The self-alignment feature of the present invention eliminates the process variations found in prior art memory cells Then, a first photoresist layer 806 is patterned to selectively expose the source region of the to-be-formed storage transistor. By using split resist layers 806a and 806b for the resist layer 806, as shown in FIG. 12E, the present invention can prevent problems such as dielectric breakdown or reduction of the charge through the oxide Qbd of the tunnel oxide layer caused by charge-up that may occur during the subsequent ion implanting steps.

The source region is formed by a first N-type implant 808, in one embodiment a phosphorus implant at an energy of 50–100 keV and a dosage between $2E14/cm^2$ and $8E14/cm^2$, and a second N-type implant 807, in one embodiment an Arsenic implant at an energy of 40 to 60 keV and a dosage between $2E15/cm^2$ and $6E15/cm^2$. Both implants are driven in using conventional times and methods.

As a result of the two ion implantation above, impurities (phosphorus, arsenic) are also doped into the substrate through opening 30 of the resist layer 806 to form impurity diffusion layers 23a and 23b.

A second photoresist layer 809 is patterned to selectively expose the drain region of the storage transistor (also the source region of the access transistor). The drain region is formed by a first p-type implant 811, in one embodiment a Boron implant at an energy of 20 to 40 keV and a dosage between $1E13/cm^2$ and $3E13/cm^2$, and a second N-type implant 810, in one embodiment an Arsenic implant at an energy of 40 to 60 kev and a dosage between $2E15/cm^2$ and $6E15/cm^2$.

Finally, a third photoresist layer 812 is patterned to selectively expose the drain region of the access transistor. The drain region 813 is formed by a standard N-type implant, in one embodiment an Arsenic implant at an energy of 40 to 60 keV and a dosage between $2E15/cm^2$ and $6E15/cm^2$.

The present embodiment which includes both the access transistor 401 (FIG. 8) and a storage transistor 402 provides many advantages. First, the erasing of the storage transistor 402 may leave the memory cell 400 with a negative threshold voltage, thereby causing leakage and eventually rendering the circuit inoperable. With an access gate 401, the memory cell 400 does not conduct current even if the erased threshold voltage of the storage transistor 402 becomes negative. As known by those skilled in the art, the erased threshold voltage can vary over the lifetime of the device and over the population of the memory cells in the device and may be difficult to control. Thus, control of the erased threshold voltage is of major concern for high density flash memory devices. With the access transistor 401 of the present embodiment, this problem is totally eliminated.

Second, with an access transistor included in each memory cell, each bitline can have a separate source metal connection The sense amplifier design can take advantage of this connection by providing a source bias voltage that limits the voltage drop incurred on the drain bitline during sensing. This sense amplifier feedback is active in cases where a large number of memory cells are conducting, thus pulling the drain bitline strongly to voltage source Vss (ground). The time to recover from a low bitline drain voltage, back to the original bitline voltage to a new sensing cycle, depends on the bitline voltage after sensing. By using this source feedback technique, the present invention significantly limits the recovery time, even for large variations of the number of memory cells active during a read operations Third, punch-through in the memory cell from drain to source causes leakage in unselected memory cells during programming. The accumulated leakage from all memory cells connected to the same bitline can reach levels where the drain voltage available to program the selected memory cell is limited by the voltage drop in the bitline select logic load line, thereby causing the programming time for the selected cell to increase. For EPROM and flash cells without access gates, the punch through concern is normally what limits the cells gate length on the short side. The punch through voltage is lower for a floating gate device, compared to a standard MOS device because of the capacitive coupling of the high drain voltage onto the floating gate of the cell. By this coupling, the effective floating gate voltage may increase until the transistor starts to conduct by normal inversion-channel turn-on of the device, as opposed to sub-surface punch through seen in a normal MOS element. The capacitive coupling does not scale with the scaling of the gate channel length, making this effect the limitation to scaling of floating gate devices.

With the access transistor included in the memory cell of the present embodiment, the punch through voltage is taken up by the access gate, and the channel length of the storage transistor can be scaled down until read-disturb becomes the limitation. This means that the target channel length of the storage transistor can be lowered, thus providing (i) higher read currents and faster sensing in logic operation, and (ii) increased speed of programming. The speed of programming increase exponentially with lower channel length.

Fourth, in accordance with the present invention, the control gate and the access gate are independent of one another, In the read mode. All the control gates are set at 5V and the selected access gate is taken from 0V to 5V. In this manner, the capacitance of the memory bit is advantageously not coupled to the associated bit line.

Fifth, in accordance with the present embodiment, dielectric breakdown or reduction of charge through the oxide Qbd at the tunnel oxide layer can be prevented by lessening the quantity of charges flowing through the tunnel oxide layer directly underneath the floating gate during the ion implantation step. As a result, the number of programming/erase operations available for a flash memory cell or its data retention characteristics can be improved.

Experimental Example

The data retention characteristics were measured for each memory cell of a flash EEPROM fabricated using an array of memory cells, as shown in FIG. 10, in accordance with the fabrication method of the present invention. In the experiment, a 1M-bit flash EEPROM was fabricated as a test sample. The sample was written and the rate of data retention over an elapsed time was observed while maintaining the sample temperature at constant 250° C. in a thermostatic chamber.

Figure 13:
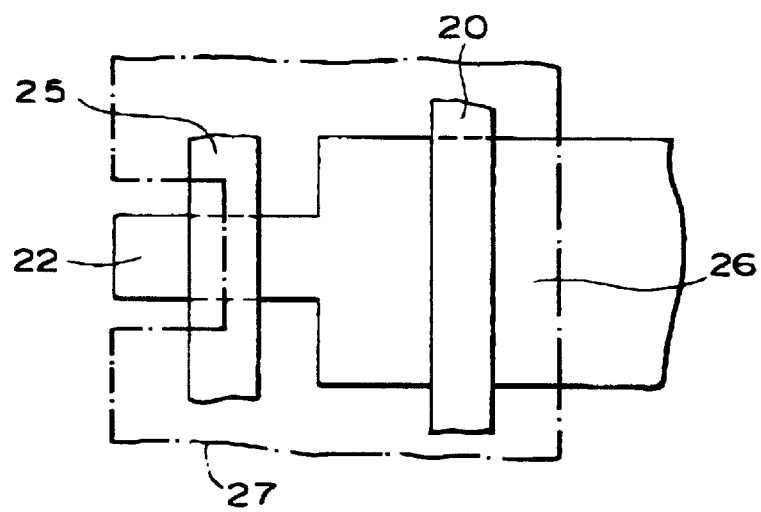
FIG. 13 is a plan view showing the resist layer used in the steps to fabricate a flash memory cell for comparison purposes.

For comparison purposes, a comparative sample was fabricated using a resist layer configured with a design as shown in FIG. 13, in place of the one shown in FIG. 12E, as the first resist layer in the fabrication process. Referring to FIG. 13, the reference numeral 22 indicates the source forming region, the reference numeral 26 represents the drain forming region, the reference numeral 25 represents the gate electrode of the storage transistor, and the reference numeral 20 represents the gate electrode 20 of the access transistor. The resist layer 27 is formed to cover the entire region other than the source forming region 22. The comparative sample fabricated using the first resist layer 27 as above was tested for data retention characteristics of each memory cell with the same procedures as the sample.

Figure 14:
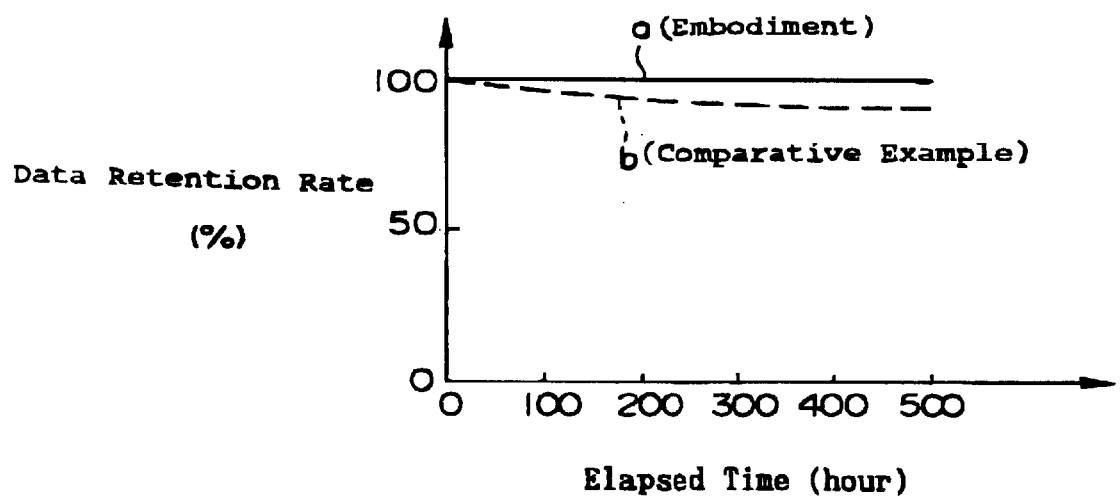
FIG. 14 is a graph indicating the data retention characteristics for the flash memory cell according to an embodiment as shown in FIG. 8 and FIG. 9, and a comparative example.

FIG. 14 shows the data retention characteristics obtained for the sample and the comparative sample. In FIG. 14, the horizontal axis represents the elapsed time, and the vertical axis represents the rate of data retention in percentage against the data volume at zero elapsed time as 100%. As can be seen in FIG. 14, it has been verified that the sample of the present invention has the ability to maintain the rate of data retention nearly unchanged for approximately 500 hours. By contrast, the chart shows that the rate of data retention in the comparative example decays to approximately 90% after an elapsed time of 500 hours.

Fifth Embodiment

Figure 15A:
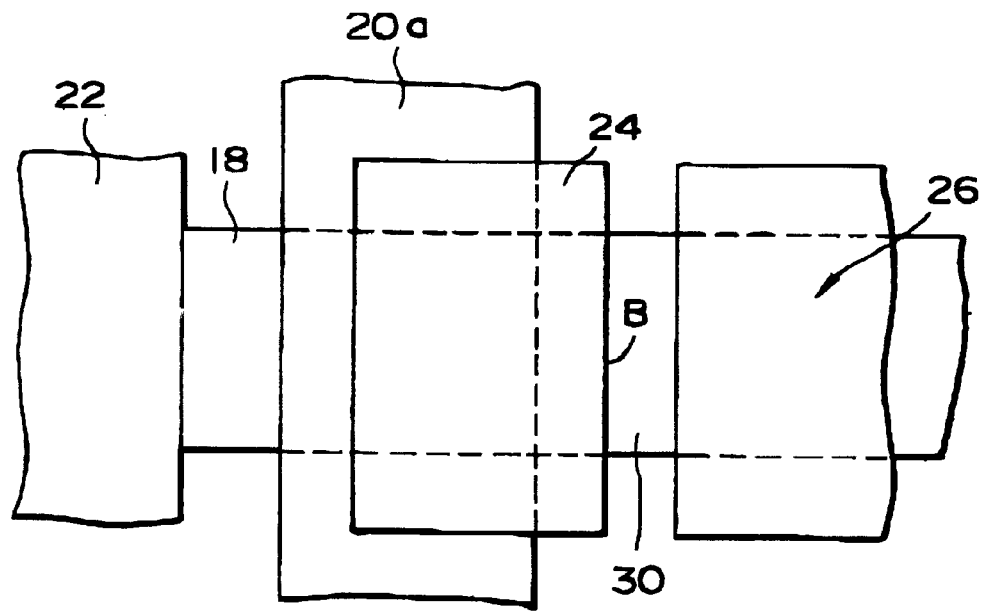
FIG. 15A and FIG. 15B are a plan view and a cross-sectional view, respectively, showing the resist layer configuration for an ion implantation into a source forming region in accordance with a fifth embodiment.
Figure 15B:
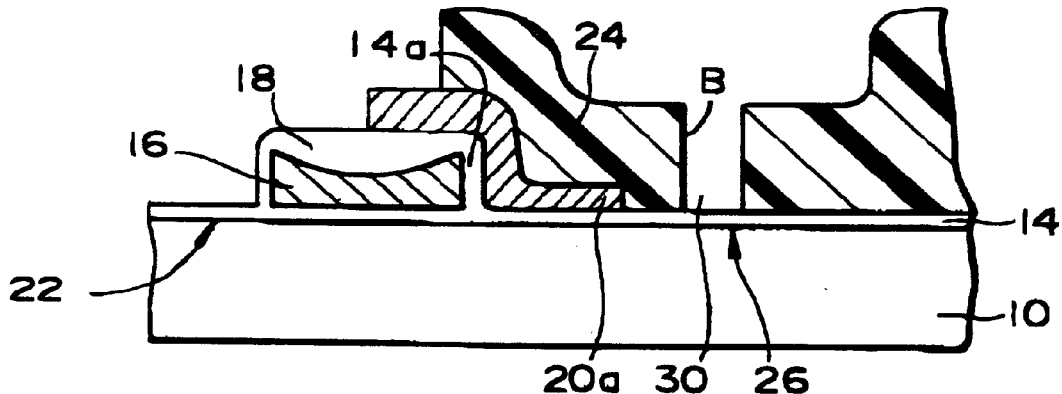
Figure 15C:
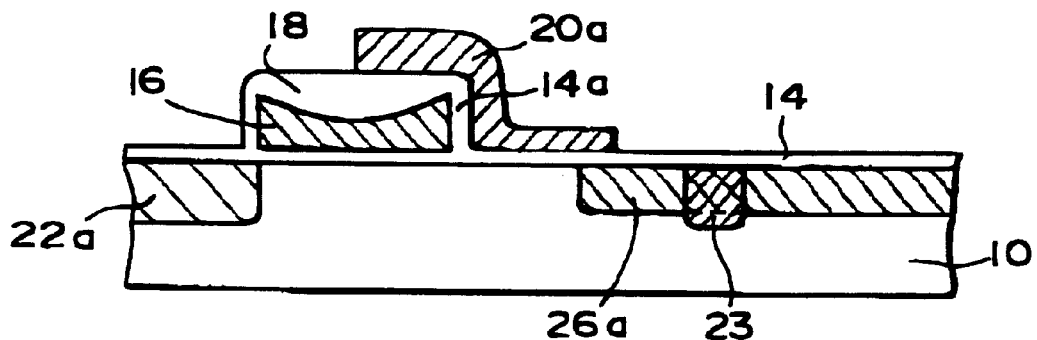
FIG. 15C is a cross-sectional view of a flash memory cell according to the fifth embodiment.

FIGS. 15A through 15C illustrate the fifth embodiment FIG. 15A and FIG. 15B are a plan view and a cross-sectional view, respectively, showing the resist layer configuration for ion implantation into a source forming region, and FIG. 15C is a cross-sectional view of a flash memory cell according to the present embodiment.

In the present embodiment, the present invention is applied to a split-gate type flash memory cell. As shown in FIG. 15C, the split-gate type flash memory cell include a gate insulation layer 14, a floating gate 16, an intermediary dielectric layer 18 and a control gate 20a, all superimposed in a single cell, with a tunnel oxide layer 14a formed between the floating gate 16 and the control gate 20a.

The fabrication method of the present invention can also be applied to the above split-gate type flash memory cell. As shown in FIGS. 15A and 15B, the resist layer 24 has, in addition to an opening in the source forming region 22 for ion implanting impurities, another opening 30 in the drain forming region 26. As with the embodiments described previously, the forming of the opening 30 permits charges accumulating in the ion implanting step to flow to the drain forming region 26 through the edge-wall B constituting the opening 30, thereby enabling the prevention of dielectric breakdown or reduced charge through the oxide Qbd at the tunnel oxide layer 14a and the gate oxide layer 14 directly underneath the floating gate 16. As a result, the device of the present embodiment can have an improved number of programming/erase operations available and high performance in data retention characteristics and the like.

While the aforementioned embodiments give examples of MOS elements with a stacked structure or a split structure, the present invention may be applied equally to semiconductor devices having other types of multi-layered gate electrodes. In such multi-layered gate electrodes, when insulating layers are built among a multiple number of conductive layers, the dielectric breakdown tends to occur at the most fragile layer among the insulating layers such as a gate oxide layer or a tunnel oxide layer as well as an intermediary dielectric layer. In other words, even a semiconductor device having multi-layered gate electrodes has a problem similar to a single-layered gate electrodes. That is, charges built up during an ion implantation of impurity cause an insulating layer to generate electric potential difference through the edges of openings in the resist layer, resulting in such problems as dielectric breakdown, reduction in the charge through the oxide Qbd, or creation of a large number of electrically neutral electron traps in the insulation layer resulting in an undesirably high threshold voltage.

Note that the fragile layer mentioned above means a layer that is most prone to cause dielectric breakdown or a reduction in the charge through the oxide Qbd, as determined by the characteristics such as thickness or structure of the layer. When the gate electrode such as the floating gate or the control gate are built with two or more layers, intermediary dielectric layers are prepared between the gate electrodes. Some of the multi-layered structures tend to cause dielectric breakdowns at a gate oxide layer or other intermediary dielectric layers during an ion implanting process step.

Accordingly, the present invention is effective not only in semiconductor devices having a single-layered gate electrode but also in those having a multi-layered gate electrode. Further, the present invention is effective in semiconductor devices based on a combination of a single-layered gate electrode and a multi-layered gate electrode as well.

Moreover, the present invention is effective particularly in a MOS element having a thin gate oxide layer or a tunnel oxide layer of a thickness between 5 to 15 nm with a large capacitance. Furthermore, although the aforementioned embodiments other than the second embodiment describe examples wherein the present invention is applied in an ion implanting process for source forming regions, the present invention is equally applicable in the implanting process for drain forming regions.

What is claimed is:

1. A method of fabricating a semiconductor device including MOS elements comprising the steps of: forming a gate insulation layer on a semiconductor substrate; forming a gate electrode on the gate insulation layer; and implanting impurity ions into source and drain forming regions, wherein the ion implantation into said source and drain forming regions is performed in a separate ion implanting steps, wherein in the step of implanting ions for said source forming region, a first resist layer is provided on the drain forming region, in the step of implanting ions for said drain forming region, a second resist layer is provided on the source forming region, and wherein at least said first resist layer has an opening portion partially forming said drain forming region which extends to said gate insulation layer at a location distant from said gate electrode, said opening portion allowing charges to flow to the substrate.

2. A method of fabricating a semiconductor device including MOS elements comprising the steps of:

a step of forming a gate insulation layer on a semiconductor substrate;

a step of forming a gate electrode on said gate insulation layer;

a step of forming a first resist layer for masking an area other than a first ion implantation area including a source forming region, wherein said first resist layer has an opening portion partially forming said drain forming region which extends to said gate insulation layer at a location distant from said gate electrode;

a step of forming a source region by implanting impurity ions into said first ion implantation area;

a step of removing said first resist layer;

a step of forming a second resist layer for masking an area other than a second ion implantation area including a drain forming region;

a step of forming a drain region by implanting impurity ions into said second ion implantation area; and a step of removing said second resist layer.

3. The method of fabricating a semiconductor device including MOS elements according to claim 2, where said step of forming said second resist layer further comprises a step wherein said second resist layer is provided with a wall extending to said gate insulation layer.

4. The method of fabricating a semiconductor device including MOS elements according to claim 1, wherein at least one of said first and second resist layers are formed separately for every individual cell or for every individual block, each consisting of multiple cells.

5. The method of fabricating a semiconductor device including MOS elements according to claim 1, wherein said opening is formed continuously in a slit-like shape in said first resist layer.

6. The method of fabricating a semiconductor device including MOS elements according to claim 1, wherein said opening is formed partially and discontinuously in said first resist layer.

7. The method of fabricating a semiconductor device including MOS elements according to claim 1, wherein said gate insulation layer has a thickness between 5 and 15 nm.

8. The method of fabricating a semiconductor device including MOS elements according to claim 1, wherein said gate electrode has a single conductive layer.

9. The method of fabricating a semiconductor device including MOS elements according to claim 1, wherein said gate electrode has multiple conductive layers each electrically isolated by an intermediary dielectric layer.

10. The method of fabricating a semiconductor device including MOS elements according to claim 9, wherein said gate electrode includes a floating gate and a control gate.

11. The method of fabricating a semiconductor device including MOS elements according to claim 1, having a first gate electrode comprising a single conductive layer and a second gate electrode including a floating gate and a control gate.

12. A method of fabricating a semiconductor device including MOS elements comprising the steps of:

a step of depositing a gate insulation layer on a semiconductor substrate;

a step of forming a gate electrode on said gate insulation layer;

a step of forming a first resist layer for masking a second ion implantation area and having a first edge-wall and a second edge-wall, wherein said first edge-wall is provided on said gate electrode and said second edge-wall is provided on said gate insulation layer which is deposited on said second ion implantation area, said second edge-wall partially forming a wall of an opening portion which extends to said gate insulation layer at a location distant from said gate electrode;

a step of implanting impurity ions into a first ion implantation area using said first resist layer as a mask;

a step of removing said first resist layer;

a step of forming a second resist layer for masking said first ion implantation area and having a first edge-wall and a second edge-wall, wherein said first edge-wall is provided on said gate electrode and said second edge-wall is provided on said gate insulation layer which is deposited on said first ion implantation area, said second edge-wall partially forming a wall of an opening portion;

a step of implanting impurity ions into a second ion implantation area using said second resist layer as a mask; and a step of removing said second resist layer.

* * * * *